United States Patent [19]

Kahng

[11] 4,214,359
[45] Jul. 29, 1980

[54] MOS DEVICES HAVING BURIED TERMINAL ZONES UNDER LOCAL OXIDE REGIONS

[75] Inventor: Dawon Kahng, Bridgewater Township, Somerset County, N.J.

[73] Assignee: Bell Telephone Laboratories, Incorporated, Murray Hill, N.J.

[21] Appl. No.: 967,222

[22] Filed: Dec. 7, 1978

[51] Int. Cl.² ............................................. B01J 17/00
[52] U.S. Cl. ........................................ 29/571; 29/578; 357/23
[58] Field of Search ...................... 29/571, 578; 357/23

[56] References Cited

U.S. PATENT DOCUMENTS

| | | | |
|---|---|---|---|
| 3,533,158 | 10/1970 | Bower | 29/571 |
| 3,600,647 | 8/1971 | Gray | 29/571 |
| 3,950,777 | 4/1976 | Tarui . | |
| 4,050,965 | 9/1977 | Ipri | 29/571 |
| 4,173,818 | 11/1979 | Bassous | 29/571 |

OTHER PUBLICATIONS

IEEE, IEDM, Tech. Digest, Wash. D.C., "DIMOS-*-A Novel . . . MOSFET," by Tihanyi, pp. 399–401, 1977.

Primary Examiner—W. C. Tupman
Attorney, Agent, or Firm—H. W. Lockhart

[57] ABSTRACT

A method of making MOS devices, primarily in integrated circuit form, is disclosed. Device areas first are defined on a silicon semiconductor chip, typically by means of a silicon nitride pattern 13A–13B. This pattern then is used to locate impurity introductions and to define areas of semiconductor surface portion removal. The latter operation produces mesas 16–17 coincident with the device areas. By this combination of steps and silicon oxide regrowth 27 where silicon has been removed, well-defined conductivity type zones are formed under the silicon oxide portions to function as buried terminal zones 28, 29, 30 of MOS devices. In the sole critical mask registration step, one edge 38 of the gate electrode 31 is located relative to the boundary 39 of a buried terminal zone 28. Finally, the channel zone 34 and the other terminal zone 33 of an MOS transistor are emplaced by a self-alignment process, followed by a heating step which adjusts final device dimensions.

7 Claims, 6 Drawing Figures

MOS DEVICES HAVING BURIED TERMINAL ZONES UNDER LOCAL OXIDE REGIONS

BACKGROUND OF THE INVENTION

This invention relates to a method of fabricating semiconductor devices, and more particularly, MOS devices in integrated circuits.

There is a continuing effort in the semiconductor integrated circuit art to achieve greater device densities and increased operating speeds, both of which are enhanced by making each individual device smaller. In the field of MOS memories in particular, memory capacity is directly related to the number of devices and thus for a given size semiconductor chip, greater device density means greater memory capacity. Generally, smaller devices have been achieved by reducing the feature size in planar devices using improved photolithography. However, as feature size approaches one micron, the practical limits of the photolithographic art are being encountered where adequate pattern definition is extremely difficult and costly to achieve.

Reduction in MOS device dimensions, particularly the important dimension of channel length, has been achieved in planar devices by fabrication of the so-called double-diffused MOS (DMOS) devices such as are disclosed in U.S. Pat. No. 3,950,777. The planar DMOS structure does not have a self-aligned gate and as a consequence exhibits high gate-to-source and gate-to-drain capacitances. In addition, the drain drift space requires precise lateral dimensional control and entails more masking steps than conventional planar MOS devices.

The double implanted MOS structure disclosed by J. Tihanyi and D. Widmann, Technical Digest, 1977, IEEE, IEDM, Washington, D.C., page 399, eliminates the disadvantage of high gate-to-source capacitance. It is, however, basically a planar MOS device with lateral dimensional control problems.

Thus an object of this invention is an MOS device which is smaller in size and is achieved with a high degree of precision without straining the limits of the photolithographic art.

SUMMARY OF THE INVENTION

In accordance with an embodiment of the invention, an MOS transistor, consisting of a source, a drain and a gate controlled channel, is fabricated with very small dimensions enabling a large number to be included in a given volume of semiconductor material. Generally this device is achieved in integrated circuit form by means of a combination of impurity introduction processes, ion implantation or diffusion, and local oxide growth to effect a quasi-vertical configuration.

More specifically, a silicon nitride pattern first is established on the surface of a silicon semiconductor chip to define thereunder areas in which active devices are formed including MOS transistors, MOS diodes and contacts to the buried terminal zones of such active devices. An array of mesas, each representing an active device area, is produced by removing unmasked semiconductor material, typically by etching. A photoresist pattern supplementing the silicon nitride pattern defines a selective ion implantation step for introducing impurities which, after subsequent diffusion, form buried terminal zones of active devices. Precise alignment of the supplemental photoresist pattern is not necessary because the critical dimension is self-aligned by edges of the nitride mask. It is the nitride mask edge which defines the boundary of this impurity implantation with other portions of an active device.

As mentioned above, the implanted impurity is diffused by heat treatment which also produces oxide isolation portions between the mesas. The local oxide growth advantageously is done in accordance with the method disclosed in application Ser. No. 903,123, filed May 5, 1978, by this applicant and T. A. Shankoff. As a result of these steps, a buried terminal zone is formed under an isolation oxide portion. In particular, the drain terminal zone is positioned and the drain drift space is defined, at least in part, by this oxide growth process which is primarily a vertical dimensioning procedure.

In the next step, by means of a photomask, one edge of the gate electrode is located with respect to the boundary of the drain zone. More specifically, the edge of the gate electrode which is on top of the mesa, is located a specified lateral distance from the drain zone boundary nearest the channel. This step, while requiring precision, has a registration tolerance of about one-quarter of the nominal feature size which is not an undue requirement.

Next, the channel and source zones are formed using the gate electrode as a self-alignment feature, and the channel length is determined much in the fashion of the DMOS structure. It will be appreciated that by means of further heat treatment the various critical dimensions including channel length and drain drift space are adjusted.

The device structure is completed in conventional fashion by the formation of suitable contacts, application of passivation layers, and formation of interconnecting metallization patterns.

From the foregoing it is evident that where previous methods relied critically upon photolithographic techniques for lateral dimensional control, devices in accordance with this invention are fabricated to small but precise dimensions using primarily heat treatments to move the boundaries of impurity zones or silicon oxide-silicon interfaces which provide the definition of this device structure.

BRIEF DESCRIPTION OF THE DRAWING

The invention and its other objects and features will be more clearly understood from the following detailed description taken in conjunction with the drawing in which.

DETAILED DESCRIPTION

Figure 1:
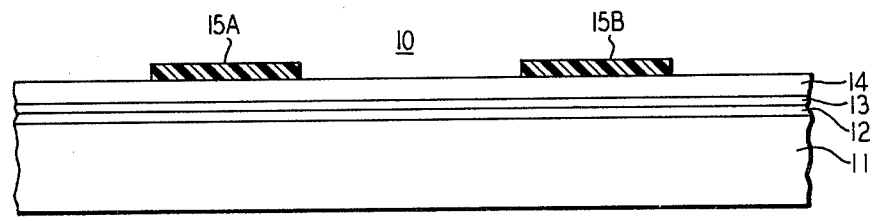
FIGS. 1 through 6 show in cross-section a portion of a semiconductor chip illustrating the successive steps in fabricating MOS devices in a portion of an integrated circuit in accordance with this invention.

FIG. 1 shows in section a portion 10 of a silicon semiconductor chip at an early stage of fabrication into an integrated circuit device of the MOS type. The portion 10 comprises single crystal silicon chip portion 11, typically of <111> or <100> crystalline orientation and in one specific embodiment it is of P-type conductivity with an impurity concentration of approximately $5 \times 10^{15}$ atoms/cm$^3$. The upper major surface of the silicon chip portion 11 is covered with a thermally grown silicon dioxide layer 12 having a thickness of about 500 Å. This value is not critical and the layer 12 may be thicker.

On top of the oxide layer 12 there is formed, typically by chemical vapor deposition (CVD) a silicon nitride layer 13 having a thickness of about 1500 Å, which, again, is not a critical value. On top of the nitride layer 13 there is another silicon dioxide layer 14 which, however, is formed by deposition, typically by a chemical vapor process. This oxide layer is provided as a part of the process for subsequently patterning the silicon nitride layer 13, generally in accordance with the disclosure of U.S. Pat. No. 3,479,237 to A. A. Bergh and W. Van Gelder. Thus, there is formed on top of the oxide layer 14 a layer of photoresist which is patterned to leave the portions 15A and 15B each of which define what will be termed herein a device area. Using suitable etchants, first the unmasked portions of oxide layer 14 are removed and then, similarly, unmasked portions of nitride layer 13. The photoresist portions 15A and 15B then are removed, as are the portions of oxide layer 14 thereunder leaving silicon nitride portions 13A and 13B, shown in FIG. 2, defining a pair of device areas. An alternative procedure for defining the silicon nitride layer 13 which omits the use of oxide layer 14 is by means of masked plasma etching.

The term, device area, describes a portion of the semiconductor chip within which not only an active semiconductor device may be fabricated but also in which means may be provided for connecting to buried zones or for making crossunders. In addition to standard MOS transistors or IGFETs in the device areas, load transistors, generally of a simpler, more tolerant design may be produced utilizing adjoining buried zones for terminals.

After the nitride pattern 13A-13B has been formed, the chip portion is subjected to an isotropic silicon etchant which produces the mesas 16 and 17 under the nitride pattern and coincident with the device areas. As suggested in the drawing, this etching produces some undercutting of the silicon nitride mask layers 13A and 13B.

Next, an ion implantation of an acceptor impurity over the entire chip surface, with the silicon nitride layers 13A and 13B acting as a mask, provides a channel stop in the surface of the silicon semiconductor material except in the mesas or device areas. This produces the p-type conductivity surface layers 18 shown in dotted outline between the mesas. The purpose and use of channel stops is well known, particularly in the MOS device art. It is advantageously included in the structures in accordance with this invention but is not an integral part of the invention.

The next step significant to the invention is the impurity introduction for ultimately forming the buried terminal zones of the devices. For this step another photoresist mask 24 is formed which, with the silicon nitride mask 13A-13B already in place, defines the location of buried terminal zones. Close realignment of photoresist mask 24 to the first mask, represented by the nitride layers 13A and 13B, is not necessary because the mask 24 serves primarily to inhibit impurity introduction in an area which later will be used for channel and source zone formation. The significant boundary of the buried terminal zones formed from this impurity introduction step is defined by the edges of the nitride mask 13A-13B which are not contiguous with a photoresist mask. The impurity introduction is by an implantation of arsenic ions at a dosage of about $10^{15}$ per cm$^2$ at 30 KEV. Alternatively, phosphorus may be implanted under substantially the same conditions. The self alignment of this implant is represented by the right most end boundary of the arsenic implanted zone, dotted outline 21, which is defined by the left edge of nitride layer 13A. Similarly, the boundaries of zones 22 and 23 closest to the mesa 17 are determined by the edges of nitride layer 13B. Thus, the buried terminal zones generally will lie at one or both sides of the base of a mesa. In the case of high performance, more critical MOS field effect transistors, only one buried terminal zone such as zone 21 is introduced to ultimately form a drain zone. In the case of zones 22 and 23, one on each side of the mesa, a less critical, load type MOS transistor, usually connected in a diode configuration is produced.

Figure 2:
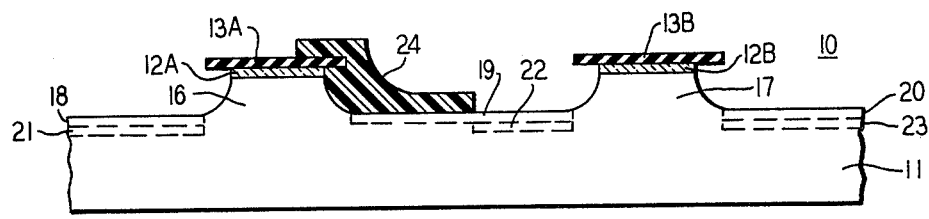

Following the implantation step in the configuration shown in FIG. 2, the photoresist mask is removed and the chip is cleaned preparatory to the next masking and oxide regrowth steps.

Figure 3:
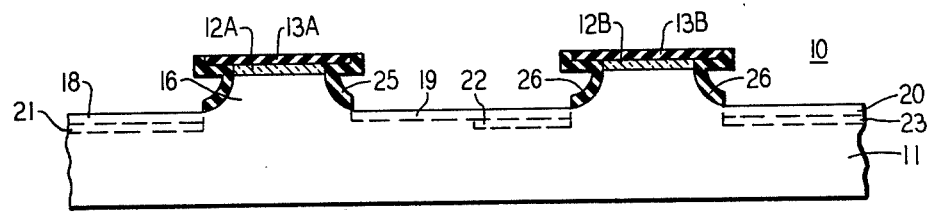

The next several steps follow the teaching of the disclosure in U.S. patent application, Ser. No. 903,123, filed May 5, 1978 by this applicant and T. A. Shankoff. In accordance with that disclosure, a silicon nitride mask 25 and 26 is formed on the sides of mesas 16 and 17 respectively, as shown in FIG. 3.

Figure 4:
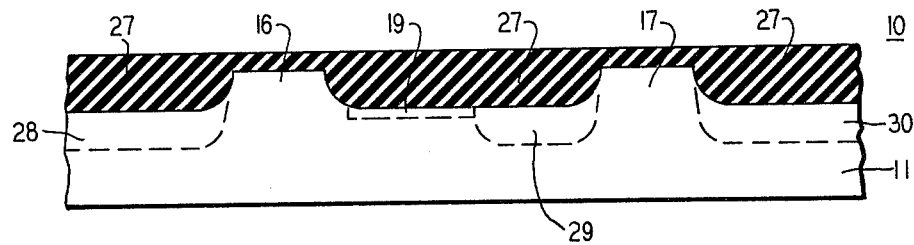

The chip then is heated in an oxidizing ambient which effects a local oxide growth region 27, as shown in FIG. 4, by the conversion of exposed silicon semiconductor material. The heating also causes diffusion of the implanted impurities, chiefly the arsenic to produce the enlarged buried terminal zones 28, 29 and 30. The arsenic presence in these zones overcompensates the channel stop acceptor impurity except in the zone 19.

The chip portion 10 as shown in FIG. 4 is subjected to a brief oxide etching step sufficient to expose the surface of the mesas and then is cleaned in preparation for growing the gate oxide. This is done by conventional heating means to form a gate oxide to a thickness of about 700 Å, in a typical embodiment, on top of the mesa.

The next step is to form a new photoresist mask to enable formation, in particular, of a gate electrode atop the left mesa 16 in which the active device is to be an MOS transistor. This gate mask is registered by relating the position of the right-hand edge 38 of the gate, which is on top of the mesa, to the right boundary 39 of the buried terminal zone 28, which constitutes the drain. The left hand edge 40 of the gate electrode 31 is not critically located and thus, the gate electrode 31 extends over the oxide portion 27, beyond the extension of the mesa edge and the drain terminal boundary 39. The considerable thickness of the oxide layer 27 between the gate 31 and the buried terminal 28 avoids any deleterious gate to drain capacitance. The right hand edge of the gate subsequently constitutes the self-alignment edge by which the channel and source zone impurities will be introduced. In a specific embodiment the lateral distance between the edge 38 of the gate and the boundary 39 of the drain is about one micron within a tolerance of plus or minus one quarter micron, a requirement presently well within the capability of the art.

Figure 5:
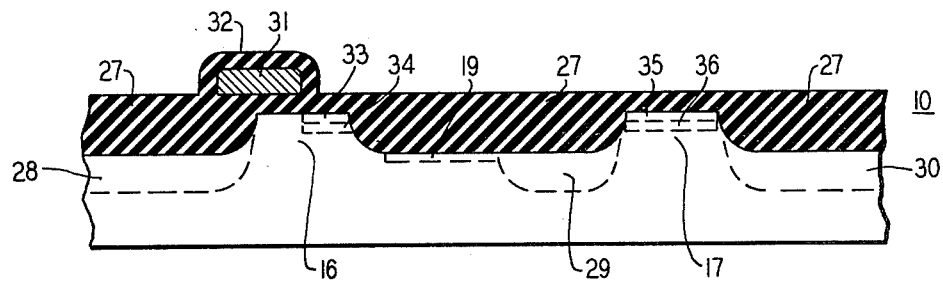

After providing the photoresist mask in the required location, the gate electrode 31 is formed. In a specific embodiment polycrystalline silicon is formed in the mask opening by chemical vapor deposition to form a gate electrode 31 as shown in FIG. 5. The gate electrode also may be formed of other suitable conductive materials as known in the art.

Then, using the gate electrode as a mask edge two ion implantations are performed to make the impurity doped layers 33 and 34. One ion implantation is of arsenic at a dosage of about $10^{15}$ ions/cm$^2$ and the other of boron at $10^{13}$ ions/cm$^2$, both at 30 KEV. The representation of the separate layers 33 and 34 ultimately for forming the source and channel zones respectively, is somewhat exaggerated for explanatory purposes. Upon initial implantation there will be little separation of the two impurities, although because of the difference in atomic weight the boron will go a little deeper. However, subsequent diffusion will result in a separation occasioned by the difference in diffusion constant between the two impurities.

Figure 6:
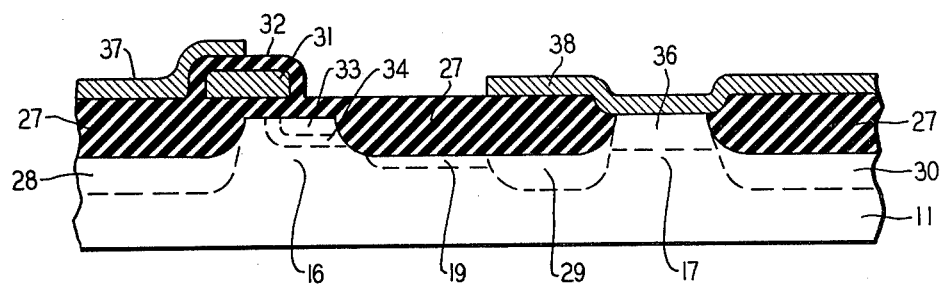

Following these implantations the chip is oxidized to provide a film 32 of silicon dioxide over the gate electrode 31. Further masking steps are used to open windows for contacts and metallization for contacts and interconnections are applied as shown in FIG. 6. For example, after the masking step to open the surface of zone 36, a relatively heavy implantation of phosphorus is applied, followed by heat treatment to enable good low resistance contact to zone 36 which is of the same conductivity type as zones 29 and 30. In particular, metal layer 38 is applied as a contact to zone 36 and the buried zones 29 and 30. Metallization layer 37 provides a connection to gate electrode 31 by way of an opening, not shown, through oxide layer 32.

Figure 7:
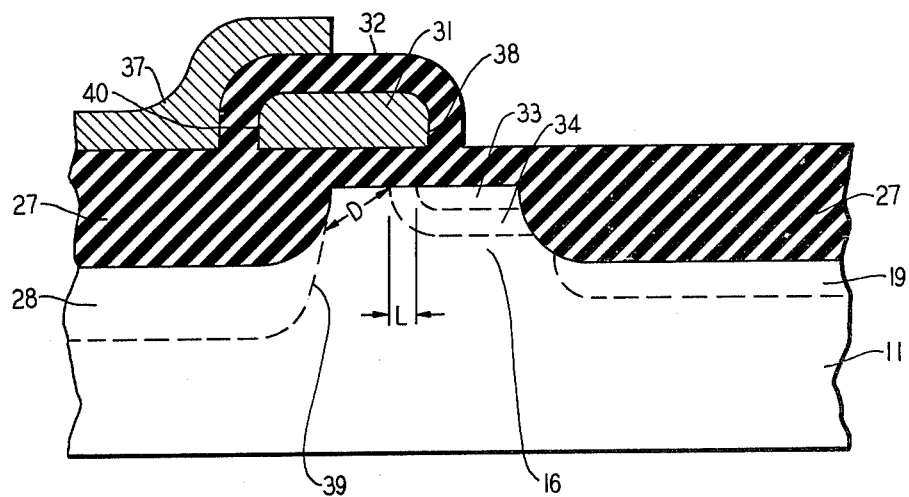

A significant aspect of the method resides in heat treatment to diffuse implanted impurities, in particular boron to form the channel of the MOS transistor. As shown in FIG. 6 and in enlarged detail in FIG. 7, the channel length L is set by the diffusion laterally and downwardly of the implanted boron impurities in zone 34. The arsenic impurities in zone 33 do not move to a significant extent and zone 33 thus forms a well defined source terminal. The boron impurities, on the other hand, move outward and form a channel zone 34 in which the boron concentration decreases across the channel toward the drain drift space denoted D. The latter is, of course, principally the lightly doped starting material which may be designated as $\pi$ conductivity type.

It should be noted that the critical drain drift space is largely a vertical dimension and a function chiefly of the depth to which the local oxide 27 has been grown and less to the placement of the boundary of the channel.

Although the invention has been disclosed in terms of particular conductivity type materials and significant impurities, it will be appreciated that the invention may be practiced also in an arrangement in which all such conductivities are reversed. Moreover, where on specific impurity is disclosed, alternative elements of the same conductivity type also may be suitable.

I claim:

1. A method of fabricating signal translating devices of the MOS type in a silicon semiconductor chip 10, said chip having at least a portion adjoining one surface of one conductivity type, said method comprising:
   (1) defining on the one surface of the chip at least one active device area,
   (2) forming from a portion of the chip adjacent the one surface at least one mesa 16 including said active device area,
   (3) making a first selective introduction of significant impurities of one conductivity type in portions of the chip other than the mesa,
   (4) heating the chip to grow surface portions 27 of silicon dioxide adjoining the mesa and to diffuse the first introduced impurities further in said chip to form terminal zones 28, 29, 30 beneath the oxide portions and adjoining at least one side of the mesa,
   (5) forming on a portion of the mesa 16 a gate electrode 31, the gate electrode having one edge 38 located on top of the mesa 16 and the opposite edge over the oxide portion adjoining the one side of the mesa, the one edge 38 of the gate electrode 31 being located a predetermined lateral distance from the end 39 of the buried terminal zone 28 under the oxide portion adjacent the one side of the mesa, said buried terminal zone constituting the drain zone,
   (6) making a second selective introduction of significant impurities of both conductivity types into the mesa portion 16 not covered by the gate electrode 31, and
   (7) heating the chip to diffuse the second introduced impurities to form a channel zone 34 and a source zone 33 and to adjust the dimensions therebetween and with the drain zone 28.

2. The method in accordance with claim 1 in which the at least one active device area is defined by the formation of a silicon nitride mask pattern.

3. The method in accordance with claim 1 in which the at least one mesa is formed by selective removal of surface portions of the chip.

4. The method in accordance with claim 1 in which the first selective introduction is by implantation of acceptor ions selected from the group consisting of arsenic and phosphorus.

5. The method in accordance with claim 1 in which portions of the chip other than the mesa includes portions which are adjacent one side of the mesa.

6. The method in accordance with claim 1 in which said gate electrode is formed of polysilicon.

7. The method in accordance with claim 1 in which said second selective introduction of significant impurities is by means of the implantation of boron and arsenic ions.

* * * * *